(12) United States Patent
Belitzer et al.

(10) Patent No.: US 11,271,600 B2
(45) Date of Patent: Mar. 8, 2022

(54) TRANSMITTERS AND METHODS FOR OPERATING THE SAME

(71) Applicant: Apple Inc., Cupertino, CA (US)

(72) Inventors: Alexander Belitzer, Munich (DE);
Yaron Yoffe, Rishon LeTsiyon (IL);
Yaniv Cohen, Hod Hasharon (IL);
Michael Kerner, Tel Mond (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/976,657

(22) PCT Filed: Mar. 27, 2018

(86) PCT No.: PCT/US2018/024455
§ 371 (c)(1),
(2) Date: Aug. 28, 2020

(87) PCT Pub. No.: WO2019/190469
PCT Pub. Date: Oct. 3, 2019

(65) Prior Publication Data
US 2020/0412391 A1    Dec. 31, 2020

(51) Int. Cl.
*H04W 76/23*     (2018.01)
*H04W 24/08*     (2009.01)
(Continued)

(52) U.S. Cl.
CPC ......... *H04B 1/0475* (2013.01); *H03F 1/0227* (2013.01); *H03F 1/3241* (2013.01);
(Continued)

(58) Field of Classification Search
None
See application file for complete search history.

(56) References Cited

U.S. PATENT DOCUMENTS 8,615,208 B2 * 12/2013 McCallister ......... H04B 1/0475
455/127.1
8,620,233 B2 * 12/2013 Brobston .............. H03F 1/3288
455/114.3

(Continued)

FOREIGN PATENT DOCUMENTS

WO     2014036143 A1    3/2014

OTHER PUBLICATIONS

International Search Report and Written Opinion for International Application No. PCT/U2018/02455, dated Dec. 26, 2018, 11 pgs.

*Primary Examiner* — Pablo N Tran
(74) *Attorney, Agent, or Firm* — Kowert, Hood, Munyon, Rankin & Goetzel, P.C.

(57) ABSTRACT

A transmitter is provided. The transmitter includes an envelope tracking circuit, wherein the envelope tracking circuit includes an envelope circuit configured to generate, based on a baseband signal, an envelope signal indicating a temporal course of the baseband signal's envelope. Further, the envelope tracking circuit includes a bandwidth reduction circuit configured to generate a bandwidth reduced envelope signal based on the envelope signal, and a DC-to-DC converter configured to generate a supply voltage for a power amplifier of the transmitter based on the bandwidth reduced envelope signal. The transmitter additionally includes a predistortion circuit configured to generate a predistorted baseband signal based on the baseband signal and an adjustable predistortion configuration. The predistortion circuit is further configured to adjust the predistortion configuration based on the bandwidth reduced envelope signal.

20 Claims, 8 Drawing Sheets

(51) Int. Cl.
*H04W 76/10* (2018.01)
*A61N 1/39* (2006.01)
*H04B 1/04* (2006.01)
*H03F 1/02* (2006.01)
*H03F 1/32* (2006.01)
*H03F 3/24* (2006.01)

(52) U.S. Cl.
CPC ......... *H03F 3/24* (2013.01); *H03F 2200/102* (2013.01); *H03F 2200/451* (2013.01); *H04B 2001/0425* (2013.01)

(56) References Cited

U.S. PATENT DOCUMENTS

| | | | |
|---|---|---|---|
| 9,093,960 B2* | 7/2015 | McCallister | H03F 1/0222 |
| 9,634,695 B1* | 4/2017 | Subrahmaniyan Radhakrishnan | H03F 3/189 |
| 10,063,265 B2* | 8/2018 | Pratt | H04B 1/0475 |
| 10,448,328 B2* | 10/2019 | Sarkas | G01R 29/10 |
| 2009/0004981 A1 | 1/2009 | Eliezer et al. | |
| 2015/0139358 A1 | 5/2015 | Asuri et al. | |
| 2015/0194988 A1 | 7/2015 | Yan et al. | |
| 2017/0005627 A1 | 1/2017 | Zhao et al. | |
| 2018/0234060 A1* | 8/2018 | Langer | H03F 1/0222 |

* cited by examiner

TRANSMITTERS AND METHODS FOR OPERATING THE SAME

FIELD

The present disclosure relates to Envelope Tracking (ET). In particular, examples relate to transmitters using ET and methods for operating a transmitter.

BACKGROUND

Conventional ET has limited bandwidth capability due to high accuracy requirements for the time alignment between the ET-path and the main signal path. For example, a time misalignment of ±0.5 nsec may already lead to inacceptable high spectral degradation for a 60 MHz Radio Frequency (RF) signal. As a consequence, conventional transmit systems for high bandwidth signals use constant supply voltages for their Power Amplifiers (PA). Using a constant supply voltage, however, reduces system efficiency. Further, the higher the bandwidth of an envelope signal, the less efficient is the DC-DC tracker.

Hence, there may be a desire for an improved ET technique.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
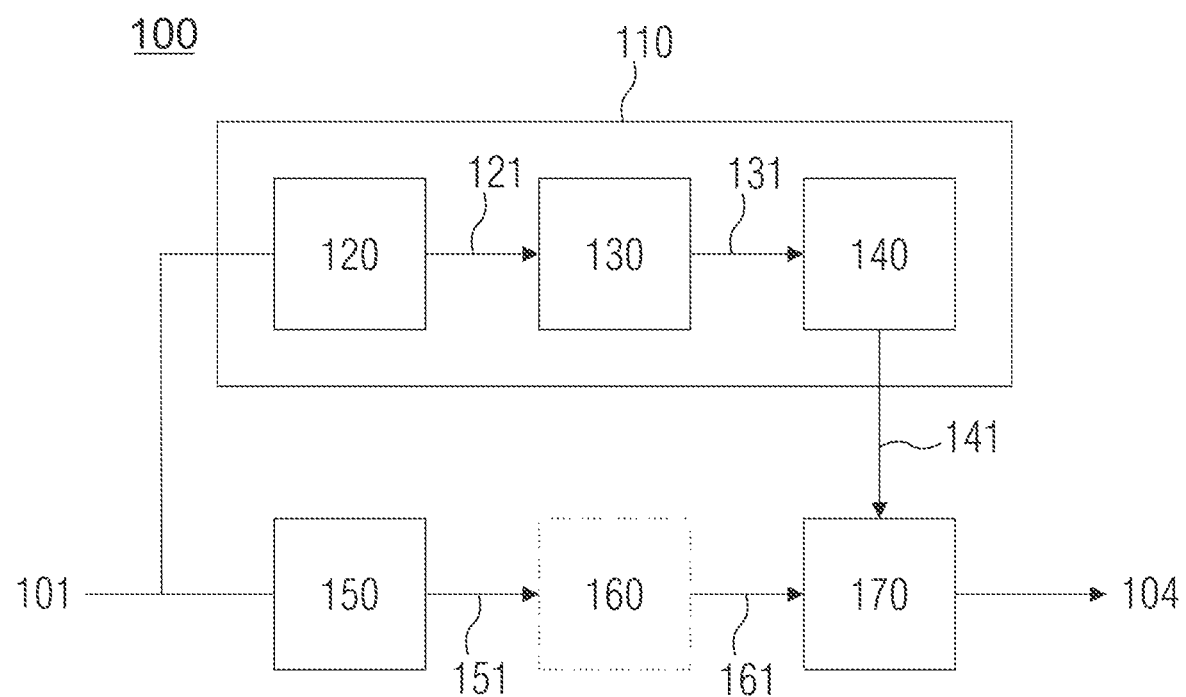
FIG. 1 illustrates a first example of a transmitter.

FIG. 1 illustrates a transmitter 100. The transmitter comprises an ET circuit 110 as well as a main signal path represented by predistortion circuit 150, mixer 160, and PA 170. The ET circuit 110 generates a supply voltage 141 for PA 170.

A baseband (transmit) signal 101 is provided to both the ET circuit 110 and the main signal path. For example, baseband signal 101 may be provided by a baseband processor. The baseband signal 101 may, e.g., be provided in Cartesian representation or in polar representation.

ET circuit 110 comprises an envelope circuit 120 configured to generate, based on the baseband signal 101, an envelope signal 121 indicating a temporal course of the baseband signal 101's envelope. The envelope of baseband signal 101 is a (smooth) curve outlining the extremes of baseband signal 101. That is, envelope signal 121 indicates the temporal course of the baseband signal 101's peak value.

The envelope signal 121 has a first bandwidth that is determined by the bandwidth of the baseband signal 101. That is, the higher the bandwidth of the baseband signal 101, the higher is the bandwidth of the envelope signal 121.

The ET circuit 110 generates the supply voltage 141 for PA 170 by means of DC-to-DC converter 140. The efficiency of the DC-to-DC converter 140 depends on the bandwidth of its control signal. A higher bandwidth of the control signal causes increased switching activity of the DC-to-DC converter 140 and, hence, higher switch losses (which corresponds to a reduced efficiency of the DC-to-DC converter 140). As indicated in FIG. 1, the DC-to-DC converter 140 is controlled based on the envelope signal 121. Hence, a high bandwidth of envelope signal 121 might reduce the efficiency of DC-to-DC converter 140. On the other hand, using ET for baseband signals with high bandwidth is desired. In order to enable ET for high bandwidths of baseband signal 101, envelope tracking circuit 110 comprises a bandwidth reduction circuit 130 configured to generate a bandwidth reduced envelope signal 131 based on the envelope signal 121. In other words, bandwidth reduction circuit 130 modifies the envelope signal 121 to reduce its bandwidth. As a result, the bandwidth reduced envelope signal 131 exhibits a second bandwidth that is lower than the first bandwidth of the envelope signal 121.

Since DC-to-DC converter 140 generates the supply voltage 141 for the power amplifier 170 based on the bandwidth reduced envelope signal 131, the analog DC-to-DC converter 140 can be operated at higher system efficiency. Further, the proposed bandwidth reduction may allow to use ET for baseband signals with increased bandwidth. For example, transmitter 100 may allow ET for bandwidths of more than 60 MHz, 80 MHz, 100 MHz, 120 MHz, 150 MHz etc.

The Main signal path comprises a predistortion circuit 150 to correct for gain/phase errors introduced by PA 170. The modification of envelope signal 121 is taken into consideration by means of predistortion circuit 150. Predistortion circuit 150 is configured to generate a predistorted baseband signal 151 based on baseband signal 101 and an adjustable predistortion configuration. That is, predistortion circuit 150 is configured to modify baseband signal 101 using the adjustable predistortion configuration. The adjustable predistortion configuration may, e.g., comprise a set of adjustable/variable predistortion coefficients and/or different adjustable sets of predistortion coefficients. The predistortion circuit 150 is configured to adjust the predistortion configuration based on the bandwidth reduced envelope signal 131. Accordingly, the predistortion of baseband signal 101 may be adapted (adjusted) to the modification of envelope signal 121 in ET circuit 110.

As indicated in FIG. 1, an optional mixer 160 in the main signal path generates a RF (input) signal 161 for PA 170 based on the predistorted baseband signal 151. PA 170 then amplifies the RF signal 161 using the ET based supply voltage 141 in order to generate the amplified RF signal 104 output by transmitter 100 to, e.g., a coupled antenna (not illustrated) or an intermediary filter (e.g. a duplexer or a triplexer).

While some basic principles of ET according to the proposed technique were described above in connection with FIG. 1, more detailed examples of transmitters using ET according to the proposed technique are described in the following with reference to FIGS. 2 and 3.

Figure 2:
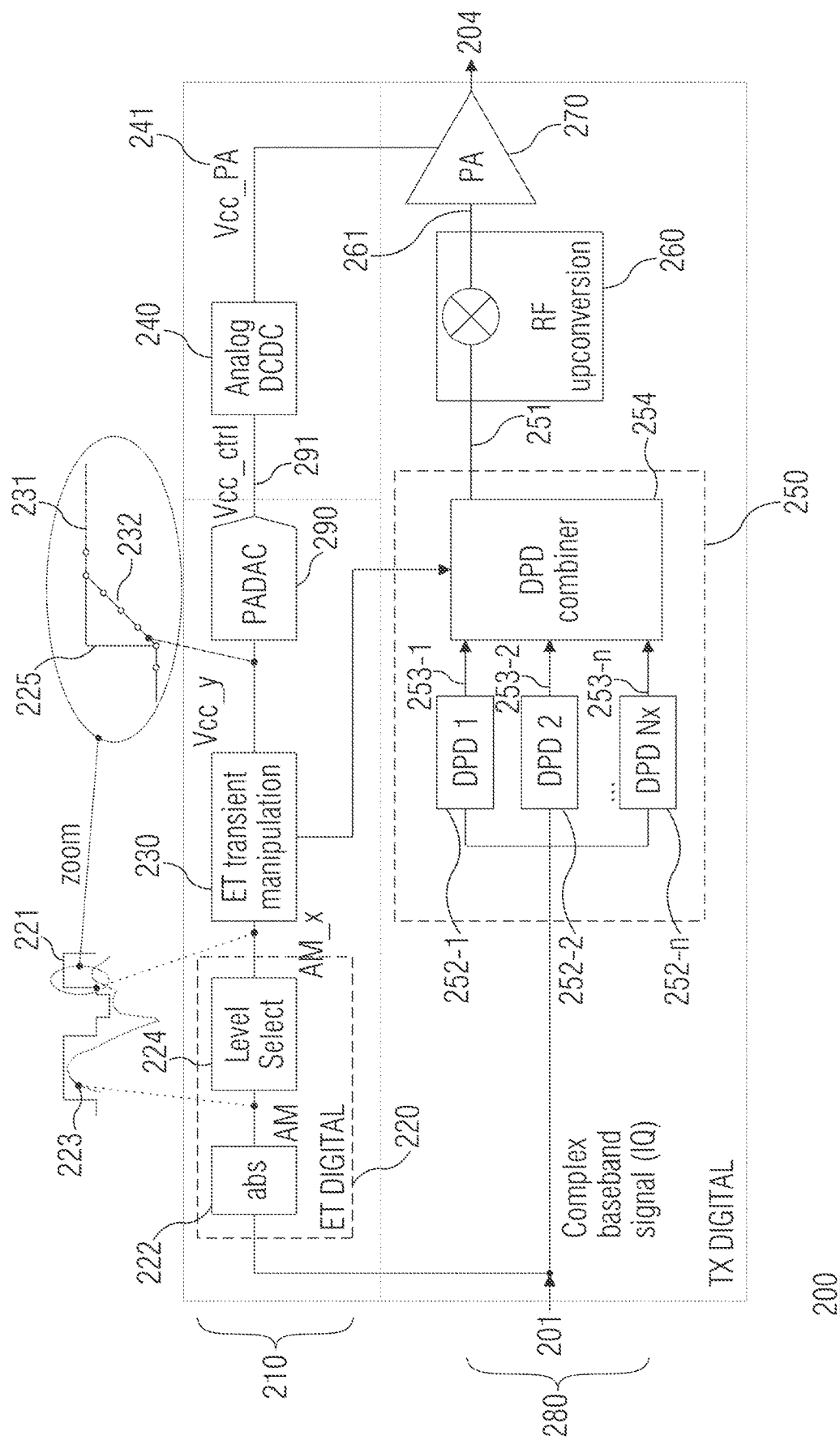
FIG. 2 illustrates a second example of a transmitter.

FIG. 2 illustrates a transmitter 200. Similar to transmitter 100, transmitter 200 comprises a main signal path 280 and an ET circuit 210. Again, a baseband (transmit) signal 201 is provided to both the ET circuit 210 and the main signal path 280. The ET circuit 210 generates the supply voltage 241 for PA 270 of the main signal path 280 by means of DC-to-DC converter 240.

ET circuit 210 comprises an envelope circuit 220 configured to generate, based on the baseband signal 201, an envelope signal 221 indicating a temporal course of the baseband signal 201's envelope. Envelope circuit 220 comprises a magnitude determination circuit 222 configured to determine the continuous temporal course 223 of the baseband signal 201's envelope. Further, envelope circuit 220 comprises a signal level selection circuit 224 configured to approximate the continuous temporal course 223 of the baseband signal 201's envelope using a plurality of discrete signal levels. Accordingly, the envelope signal 221 indicates the temporal course of the baseband signal 201's envelope using discrete signal levels. In other words, signal level selection circuit 224 translates the baseband signal 201's envelope (RF envelope) to N discrete supply levels for PA 270. Envelope signal 221 has high bandwidth.

The reduction of the envelope signal 221's bandwidth is based on the modification of signal transients between consecutive discrete signal levels in the envelope signal 221. That is, bandwidth reduction circuit 230 of ET circuit 210 is configured to generate the bandwidth reduced envelope signal 231 by modifying a transient 225 between two consecutive discrete signal levels in the envelope signal 221. Transient 225 illustrates the sudden transition from the first one of the consecutive discrete signal levels in the envelope signal 221 to the second one of the consecutive discrete signal levels. The temporal duration T of transient 225 indicates the transition time from the first one of the consecutive discrete signal levels in the envelope signal 221 to the second one of the consecutive discrete signal levels.

As indicated in FIG. 2, the bandwidth reduction circuit 230 may be configured to modify the transient 225 by replacing the transient 225 with a linear interpolation 232 between the two consecutive discrete signal levels in the envelope signal 221. An absolute value of the linear interpolation 232's slope over time is smaller than an absolute value of the transient 225's slope over time (assuming that both slopes are plotted in coordinate systems using the same scaling). The transient 225 illustrated in FIG. 2 has an exemplary slope of substantially 90°, whereas the linear interpolation 232 has a slope of substantially 45°.

ET circuit 210 further comprise a Digital-to-Analog Converter (DAC) 290 configured to generate an analog control voltage 290 for the DC-to-DC converter 240 based on the bandwidth reduced envelope signal 231. The DC-to-DC converter 240, hence, generates the supply voltage 241 for PA 270 based on the bandwidth reduced envelope signal 231 and delivers the required load current to PA 270.

As indicated above, the efficiency of DC-to-DC converter 240 depends on the bandwidth of its control signal, i.e. the bandwidth of the analog control voltage 291. The bandwidth of the analog control voltage 291 depends on the transients in the input signal for DAC 290. The shorter the temporal duration of a transient in the input signal for DAC 290, the higher is the bandwidth of the input signal and, hence, the bandwidth of analog control voltage 290 for DC-to-DC converter 240. Since the transient 225 in envelope signal 221 is replaced by linear interpolation 232 having a reduced slope, the transition time between the consecutive discrete signal levels is increased in the bandwidth reduced envelope signal 231 compared to envelope signal 221. Accordingly, the bandwidth of bandwidth reduced envelope signal 231 is decreased compared to envelope signal 221. Accordingly, DC-to-DC converter 240 may be operated at high system efficiency also for high bandwidths of baseband signal 201.

Further, the reduced bandwidth transition may allow to predict transition effects with higher accuracy. When the analog control voltage 290 exceeds the analog bandwidth of PA 240, the effect on the PA gain and phase changes may be unstable. The actual waveform that feeds the PA supply depends on the analog circuit designs (e.g. capacitance, resistance and magnetic induction) and in practice produces fluctuations that are difficult to predict and compensate.

Main signal path 280 comprises predistortion circuit 250 (e.g. using Digital PreDistortion, DPD) to correct for gain/phase errors introduced by PA 270 during transitions of supply voltage 241. Mixer 260 in main signal path 280 generates a RF (input) signal 261 for PA 270 based on the predistorted baseband signal 251. PA 270 then amplifies the RF signal 261 using the ET based supply voltage 241 in order to generate the amplified RF signal 204.

Predistortion circuit 250 is configured to generate a predistorted baseband signal 251 based on the baseband signal 201 and an adjustable predistortion configuration. Predistortion circuit 250 is further configured to adjust the predistortion configuration based on the bandwidth reduced envelope signal 231.

Predistortion circuit 250 comprises a plurality of predistorters 252-1, 252-2, ..., 252-n. For example, predistortion circuit 250 may comprise a predistorter for each of the N discrete signal levels of envelope signal 221.

Referring to the two consecutive discrete signal levels illustrated in FIG. 2, predistortion circuit 250 comprises a first predistorter 252-1 configured to generate a first auxiliary predistorted baseband signal 253-1 based on the baseband signal 201 and a first predistortion configuration. The first predistortion configuration is related to the first one of the two consecutive discrete signal levels. Further, predistortion circuit 250 comprises a second predistorter 252-2 configured to generate a second auxiliary predistorted baseband signal 253-2 based on the baseband signal 201 and a second predistortion configuration. The second predistortion configuration is related to the second one of the two consecutive discrete signal levels. $N^{th}$ predistorter 252-n is configured to generate an $n^{th}$ auxiliary predistorted baseband signal 253-n based on the baseband signal 201 and an $n^{th}$ predistortion configuration. The $n^{th}$ predistortion configuration is related to an $n^{th}$ discrete signal levels. In other words, each of the N discrete signal levels may have a dedicated predistortion configuration.

Further, predistortion circuit 250 comprises a signal combiner 254 configured to combine the auxiliary predistorted baseband signals 253-1, 253-2, ... 253-n to the predistorted baseband signal 251. For example, while the bandwidth reduced envelope signal 231 exhibits the first one of the two consecutive discrete signal levels, the predistorted baseband signal 251 may be the first auxiliary predistorted baseband signal 253-1. While the bandwidth reduced envelope signal 231 exhibits the second one of the two consecutive discrete signal levels, the predistorted baseband signal 251 may be the second auxiliary predistorted baseband signal 253-2. For the transition from the first one to the second one of the two consecutive discrete signal levels, signal combiner 254 may combine the first auxiliary predistorted baseband signal 253-1 and the second auxiliary predistorted baseband signal 253-2. For example, the signal combiner 254 may be configured to generate the predistorted baseband signal 251 using linearly changing contributions of the first auxiliary predistorted baseband signal 253-1 and the second auxiliary predistorted baseband signal 253-2 while the bandwidth reduced envelope signal 231 exhibits the linear interpolation 232 between the two consecutive discrete signal levels.

Figure 3:
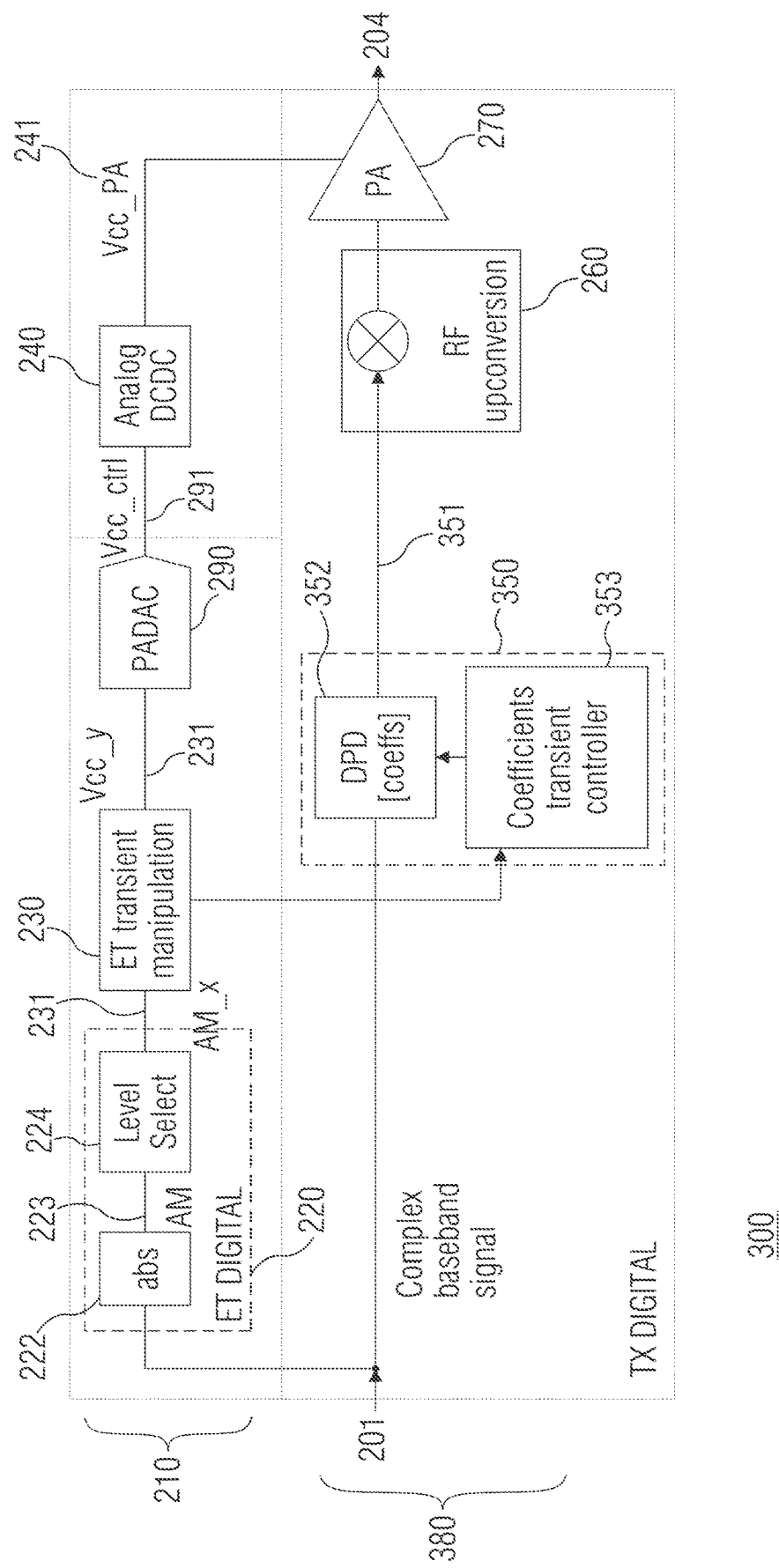
FIG. 3 illustrates a third example of a transmitter.

An alternative implementation of the predistortion is illustrated in FIG. 3 showing a transmitter 300. Transmitter 300 is identical to transmitter 200 except for the implementation of the predistortion.

Predistortion circuit 350 comprises a (single) predistorter 352 configured to generate the predistorted baseband signal 351 based on the baseband signal 201 and a set of predistortion coefficients. Further, predistortion circuit 350 comprises a predistortion configuration circuit 353 configured to adjust the set of predistortion coefficients based on the bandwidth reduced envelope signal 231. For example, predistortion configuration circuit 353 may use a dedicated set of predistortion coefficients for each of the N discrete signal levels of bandwidth reduced envelope signal 231. Referring to the two discrete signal levels illustrated in FIG. 2, predistortion configuration circuit 353 may, e.g., be configured to adjust the set of predistortion coefficients to a first set of predistortion coefficients related to a first predistortion configuration, while the bandwidth reduced envelope signal 231 exhibits the first one of the two consecutive discrete signal levels. Predistortion configuration circuit 353 may further be configured to adjust the set of predistortion coefficients to a second set of predistortion coefficients related to a second predistortion configuration, while the bandwidth reduced envelope signal 231 exhibits the second one of the two consecutive discrete signal levels.

For the transition from the first one to the second one of the two consecutive discrete signal levels, predistortion configuration circuit 353 continuously changes the first set of predistortion coefficients to the second set of predistortion coefficients. For example, the predistortion configuration circuit 353 may be configured to linearly change the set of predistortion coefficients from the first set of predistortion coefficients to the second set of predistortion coefficients while the bandwidth reduced envelope signal 231 exhibits the linear interpolation 232 between the two consecutive discrete signal levels.

In other words, instead of using multiple DPD instances and combining the individual DPD results afterwards, the system may alternatively be implemented with only one DPD instance but with coefficients being changed during the transition.

In FIGS. 2 and 3, two exemplary implementations of predistortion circuits are illustrated. It is evident from the above description that the functionality of a predistortion circuit according to the proposed technique may implemented in different ways. To conclude, a predistortion circuit according to the proposed technique may be configured to generate the predistorted baseband signal using:

a) a first predistortion configuration while the bandwidth reduced envelope signal exhibits the first one of the two consecutive discrete signal levels;

b) a second predistortion configuration while the bandwidth reduced envelope signal exhibits the second one of the two consecutive discrete signal levels; and c) a linearly changing combination of the first predistortion configuration and the second predistortion configuration while the bandwidth reduced envelope signal exhibits the linear interpolation between the two consecutive discrete signal levels.

The above described modification of signal transitions in the envelope signal together with the accordingly adapted predistortion is expressed below in terms of exemplary mathematical expressions.

The linear interpolation between two discrete signal levels may be described as follows:

a) rising transient (signal transition) in the envelope signal:

$$Vcc_{y(t)} = AM_{x1} + \frac{(AM_{x2} - AM_{x1})t}{T}; 0 < t < T \quad (1)$$

b) falling transient (signal transition) in the envelope signal:

$$Vcc_{y(t)} = AM_{x2} - \frac{(AM_{x2} - AM_{x1})t}{T}; 0 < t < T \quad (2)$$

In expressions (1) and (2), $Vcc_{y(t)}$ denotes the bandwidth reduced envelope signal, $AM_{x1}$ denotes the the first one of the two consecutive discrete signal levels, $AM_{x2}$ denotes the secand one of the two consecutive discrete signal levels, and T denotes the duration of the signal transition between the two consecutive discrete signal levels in the bandwidth reduced envelope signal.

Corresponding DPD correction factors during the transition between the two consecutive discrete signal levels may be described as follows:

a) rising transient (signal transition) in the envelope signal:

$$DPD(t) = DPD_1 + \frac{(DPD_2 - DPD_1)t}{T}; 0 < t < T \quad (3)$$

b) falling transient (signal transition) in the envelope signal:

$$DPD(t) = DPD_2 - \frac{(DPD_2 - DPD_1)t}{T}; 0 < t < T \quad (4)$$

In expressions (3) and (4), DPD(t) denotes the resulting predistortion configuration, $DPD_1$ denotes the first predistortion configuration, $DPD_2$ denotes the second predistortion configuration, and T denotes the duration of the signal transition between the two consecutive discrete signal levels in the bandwidth reduced envelope signal.

Figure 4:
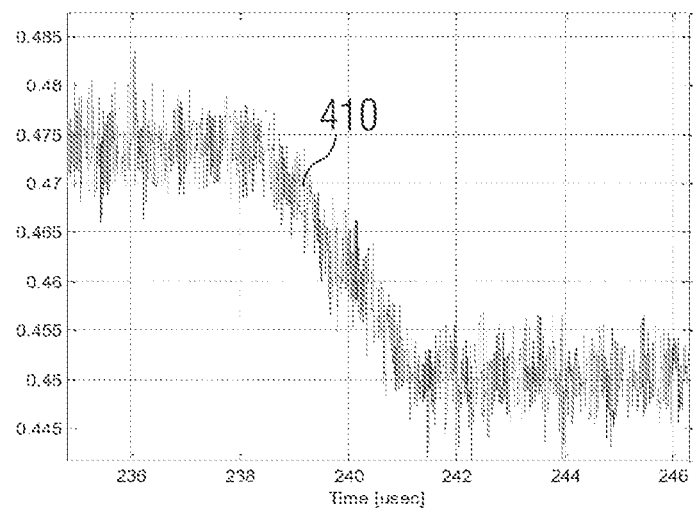
FIG. 4 illustrates an exemplary temporal course of a supply voltage for a PA.
Figure 5:
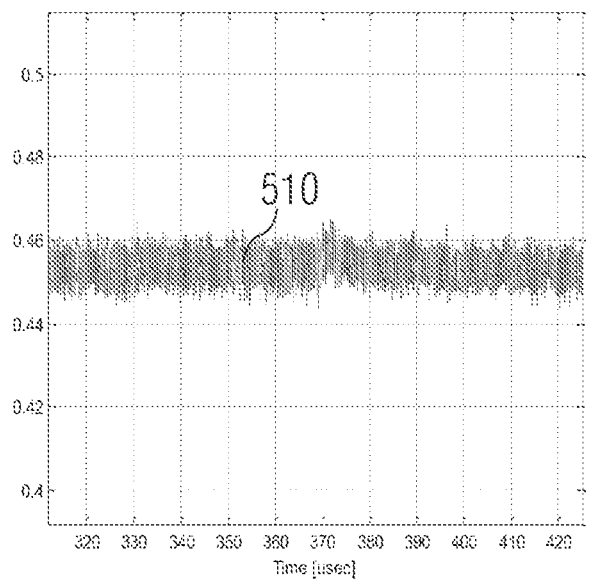
FIG. 5 illustrates an exemplary temporal course of a gain of a PA.
Figure 6:
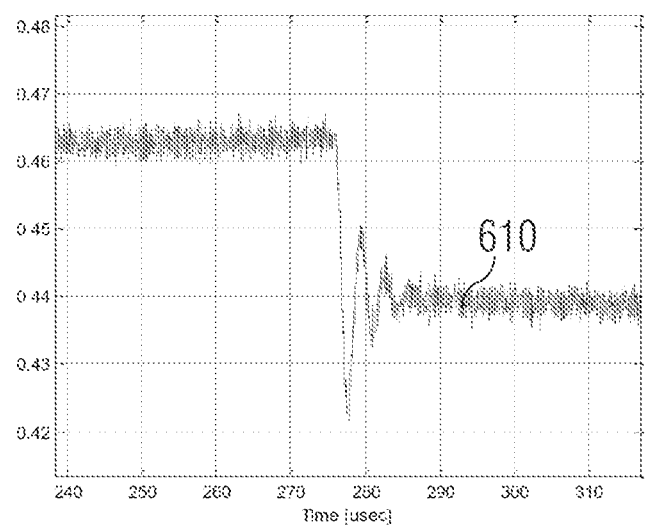
FIG. 6 illustrates reference temporal course of a supply voltage for a PA.

Effects of the proposed bandwidth reduction on the supply voltage for the PA, and the PA behavior are illustrated in FIGS. 4 to 6.

FIG. 4 illustrates an exemplary temporal course of the supply voltage 410 for the PA (in arbitrary units) during a signal transition between the two consecutive discrete signal levels in the envelope signal. Bandwidth reduction and predistortion based on above expressions 1 to 4 is used. It is evident from FIG. 4 that the supply voltage 410 smoothly changes during the transition of the envelope signal. The resulting gain 510 of the PA (in arbitrary units) is illustrated in FIG. 5. It is evident from FIG. 5 that the temporal course of the gain 510 is substantially flat, i.e. substantially no PA gain change occurs.

As a comparison, FIG. 6 illustrates a reference temporal course of the supply voltage 610 for the PA (in arbitrary units) without using the proposed bandwidth reduction and predistortion. It is evident from FIG. 6 that the resulting amplitude changes during the transition and contains fluctuations that are difficult to compensate by means of predistortion.

By using the above linear method of predistortion combination, a Root Mean Square (RMS) Error Vector Magnitude (EVM) of −40 dB may, e.g., be obtained for a 20 MHz WLAN signal with significantly improved power consumption compared to a constant supply usage. The amount of efficiency improvement is depending on the transition time T. The faster the transient (the smaller T), the higher the overall efficiency (but also the higher the required envelope bandwidth).

In the foregoing, modifying the transient between consecutive discrete signal levels in the envelope signal by linear interpolation is described. Alternatively, any digital filter or digital windowing in time domain or any other method of bandwidth reduction may be used for generating the bandwidth reduced envelop signal. For example, bandwidth reduction circuit 230 illustrated in FIGS. 2 and 3 may alternatively comprise a digital filter configured to modify the transient 225, or be configured to modify the transient 225 using a window function. If the ET transient manipulation is more complex than the above linear interpolation, the adjustment of the predistortion configuration may follow similar complexity.

The above described ET technique may enables ET for signal bandwidths of more than 60 MHz. Furthermore, controlling the envelope supply transient and using forward path predistortion may (significantly) improve the noise and the EVM. Also, the design of the analog envelope tracker may be done with a higher system efficiency, when reducing the bandwidth of the envelope signal as proposed.

Figure 7:
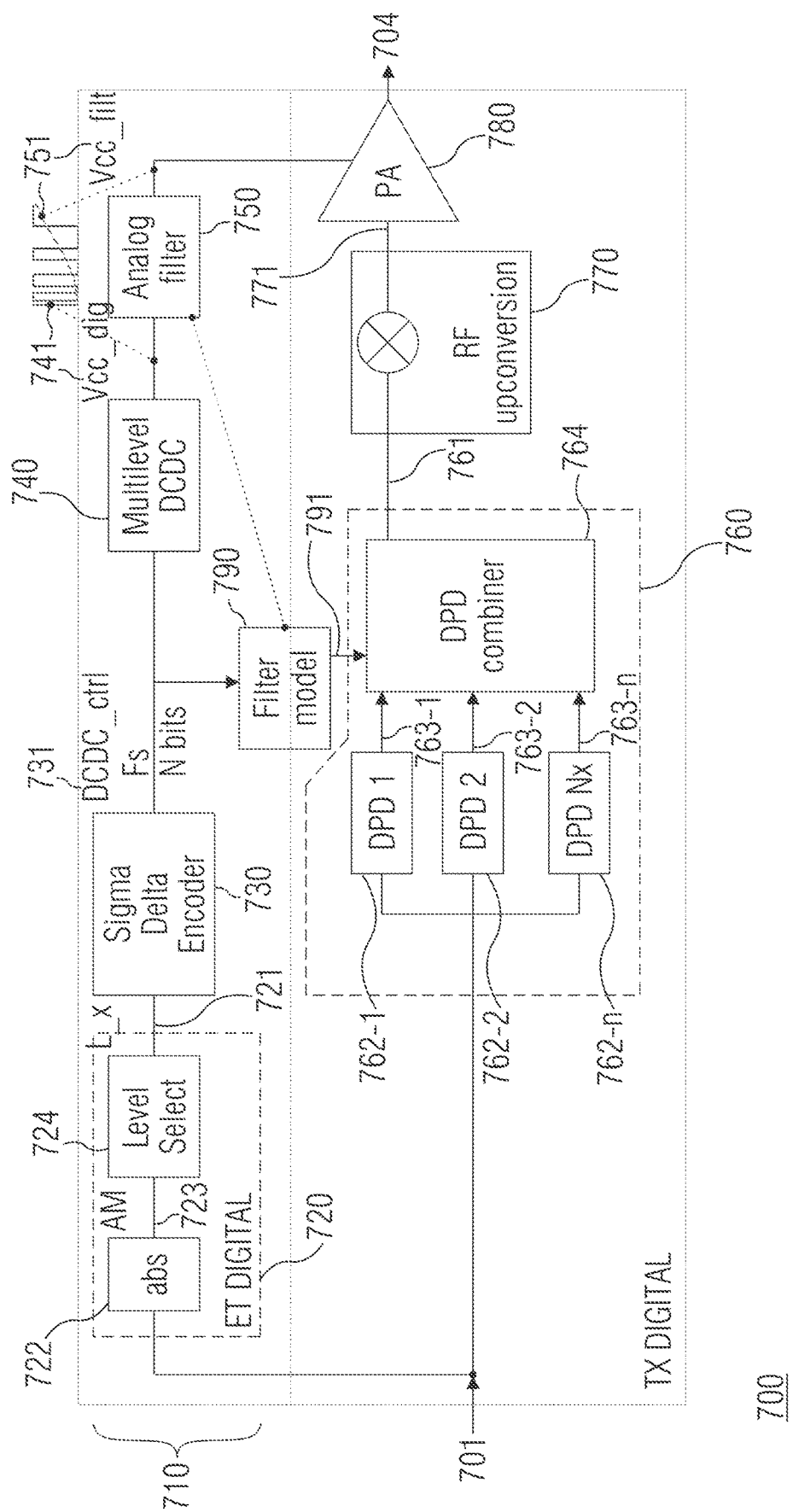
FIG. 7 illustrates a third example of a transmitter.

The above described examples use an analog DC-DC tracker in the ET circuit. Alternatively, a discrete multi-level DCDC supply may be used. This is exemplarily illustrated in FIG. 7. FIG. 7 illustrates a transmitter 700. Similar to the above described transmitters, transmitter 700 comprises an ET circuit 710 and a main signal path represented by predistortion circuit 760, mixer 770, and PA 780. Again, a baseband (transmit) signal 701 is provided to both the ET circuit 710 and the main signal path. The ET circuit 710 generates the supply voltage 751 for PA 780 of the main signal path.

ET circuit 710 comprises an envelope circuit 720 configured to generate, based on the baseband signal 701, an envelope signal 721 indicating a temporal course of the baseband signal 701's envelope. As indicated in FIG. 7, envelope circuit 720 may comprises a magnitude determination circuit 722 configured to determine the continuous temporal course 723 of the baseband signal 701's envelope. Further, envelope circuit 720 may comprises a signal level selection circuit 724 configured to approximate the continuous temporal course 723 of the baseband signal 701's envelope using a plurality of discrete signal levels. Accordingly, the envelope signal 721 may indicates the temporal course of the baseband signal 701's envelope using discrete signal levels. For example, signal level selection circuit 724 may translate the baseband signal 701's envelope to N discrete signal levels.

Further, ET circuit 710 comprises a sigma-delta encoder 730 configured to generate a pulse modulated signal 731 based on the envelope signal 721 (using sigma-delta modulation). For example, the pulse modulated signal 731 may be a pulse-width modulated signal or a pulse-frequency modulated signal. For example, sigma-delta encoder 730 may follow the N discrete signal levels of envelope signal 721 and encode it to pulse modulated signal 731 toggling between N levels.

ET circuit 710 further comprises (multi-level) DC-to-DC converter 740 following the encoded pulse modulated signal 731. That is, DC-to-DC converter 740 is configured to generate, based on the pulse modulated signal 731, a supply voltage signal 741 having predefined voltage levels. For example, DC-to-DC converter 740 may internally generates a plurality of predefined voltage levels in parallel, wherein one of the plurality of predefined voltage levels is selected by an internal multiplexer based on the discrete signal level that is encoded in the pulse modulated signal 731. DC-to-DC converter 740 may output the selected predefined voltage level as supply voltage signal 741. Compared to analog DC-DC trackers, DC-to-DC converter 740 may achieve a higher system efficiency.

An analog filter 750 is configured generate a filtered supply voltage signal 751 for PA 780 based on the supply voltage signal 741. In other words, analog filter 750 smoothens the supply voltage signal 741.

Since a sigma-delta encoder 730 is used, the noise in pulse modulated signal 731 may be shaped. The sigma-delta encoder 730 is configured to oversample envelope signal 721 (i.e. sample it with a frequency much higher than the Nyquist rate) so that noise in a band of interest at low frequencies may be reduced, while the noise at higher frequencies is increased. For example, a sample frequency of the sigma-delta encoder 730 may be selected such that shaped noise in the pulse modulated signal 731 is at frequencies of at least six, eight, ten, or twelve times a bandwidth of the baseband signal 701. The analog filter 750 is configured to remove signal components from the supply voltage signal 741 related to shaped noise in the pulse modulated signal 731. In other words, choosing a higher sampling rate (Fs) of the sigma delta encoder 730 may allow to shape the switching noise towards higher frequency offsets, where it can be filtered by relative simple and small size analog filter 750.

Further, the sampling frequency (Fs) may be chosen different from used frequency bands or transmission/reception modes in order to avoid shaped noise falling onto the critical frequency bands. Accordingly, disturbances of the own receiver or in other co-existing systems (e.g. a WLAN+ cellular co-existence) may be avoided. That is, the sample frequency of the sigma-delta encoder 730 may be different from other frequencies used within transmitter 700 (or a transceiver comprising transmitter 700).

The main signal path comprises predistortion circuit 760 (e.g. DPD) to correct for gain/phase errors introduced by PA 780 during transitions of filtered supply voltage signal 751. Mixer 770 in the main signal path generates a RF (input) signal 771 for PA 780 based on the predistorted baseband signal 761. PA 780 then amplifies the RF signal 771 using the ET based supply voltage 751 in order to generate the amplified RF signal 704.

Predistortion circuit 760 is configured to generate the predistorted baseband signal 761 based on the baseband signal 701 and an adjustable predistortion configuration. Predistortion circuit 760 is further configured to adjust the predistortion configuration based on a control signal 791 related to the pulse modulated signal 731.

A digital filter 790 is configured to generate the control signal 791 based on the pulse modulated signal 731 and a filter model. The filter model represents the signal processing behavior of the DC-to-DC converter 740 and the analog filter 750. That is, the digital filter 790 reproduces substantially the waveform of the filtered supply voltage signal 751 and controls predistortion circuit 760. As a consequence, the predistortion circuit 760 is controlled based on the actual waveform of the filtered supply voltage signal 751 so that gain/phase errors introduced by PA 780 during transitions of filtered supply voltage signal 751 may be precompensated.

As indicated in FIG. 7, predistortion circuit 760 may, e.g., comprise a plurality of predistorters 762-1, 762-2, . . . , 762-n configured to generate auxiliary predistorted baseband signals 763-1, 763-2, . . . , 763-n based on the baseband signal 701 and respective predistortion configurations. A signal combiner 764 of predistortion circuit 760 may then be configured to generate the predistorted baseband signal 761 based on adjustable contributions of the auxiliary predistorted baseband signals 763-1, 763-2, . . . , 763-n. The contributions of the auxiliary predistorted baseband signals 763-1, 763-2, . . . , 763-n are adjusted based on the control signal 791. That is, a combination of auxiliary predistorted baseband signals similar to what is described in connection with FIG. 2 may be used.

Although not explicitly illustrated in FIG. 7, the predistortion circuit 760 may alternatively comprise a predistorter configured to generate the predistorted baseband signal 760 based on the baseband signal 701 and predistortion coefficients. Further, predistortion circuit 760 may comprise a predistortion configuration circuit configured to adjust the predistortion coefficients based on the control signal 791. That is, an adjustment of predistortion coefficients similar to what is described in connection with FIG. 3 may be used.

However, the predistortion circuit 760 is not limited to the above exemplary implementations.

ET according to the technique described in connection with transmitter 700 may enable usage of a more efficient discrete multi-level DCDC for envelope tracking, further improving overall system efficiency.

Figure 8:
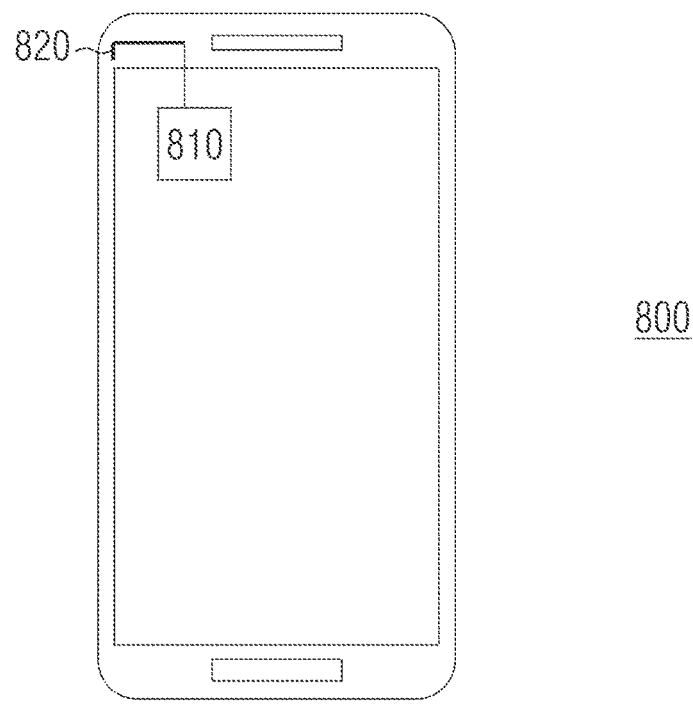
FIG. 8 illustrates an example of a mobile device comprising a transmitter.

An example of an implementation using ET according to one or more aspects of the proposed technique or one or more examples described above is illustrated in FIG. 8. FIG. 8 schematically illustrates an example of a mobile device 800 (e.g. mobile phone, smartphone, tablet-computer, or laptop) comprising at least one transmitter 810 for RF signal generation according to an example described herein. For example, transmitter 810 may be part of a RF transceiver (not illustrated). Transmitter 810 is coupled to at least one antenna element 820 for radiating the RF signal to the environment.

The mobile device 800 may comprise further elements such as, e.g., an application processor, a baseband processor, memory, an audio driver, a camera driver, a touch screen, a display driver, sensors, removable memory, a power management integrated circuit or a smart battery.

To this end, a mobile device enabling ET for high bandwidth RF signals and, hence, enabling, increased efficiency may be provided.

The above wireless communication circuits using ET or transmitters according to the proposed technique or one or more of the examples described above may be configured to operate according to one of the $3^{rd}$ Generation Partnership Project (3GPP)-standardized mobile communication networks or systems. The mobile or wireless communication system may correspond to, for example, a $5^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 9:
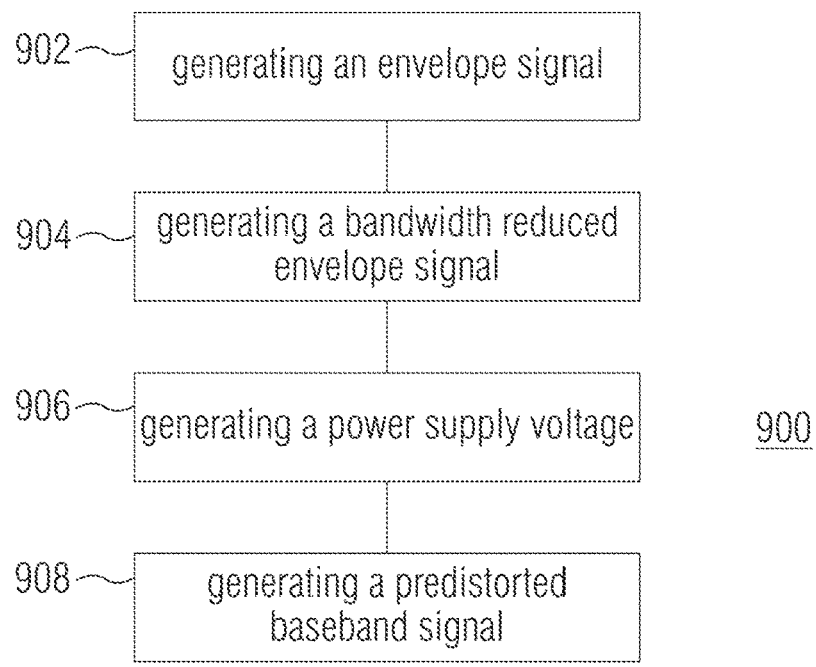
FIG. 9 illustrates a flowchart of an example of a method for operating a transmitter.

An example of a method 900 for operating a transmitter is illustrated by means of a flowchart in FIG. 9. Method 900 comprises generating 902, based on a baseband signal, an envelope signal indicating a temporal course of the baseband signal's envelope. Further, method 900 comprises generating 904 a bandwidth reduced envelope signal based on the envelope signal, and generating 906 a power supply voltage for a power amplifier of the transmitter based on the bandwidth reduced envelope signal. Method 900 additionally comprises generating 908 a predistorted baseband signal based on the baseband signal and an adjustable predistortion configuration, wherein the predistortion configuration is adjusted based on the bandwidth reduced envelope signal.

More details and aspects of the method are mentioned in connection with the proposed technique or one or more examples described above (e.g. FIGS. 1 to 6). The method may comprise one or more additional optional features corresponding to one or more aspects of the proposed technique or one or more examples described above.

Figure 10:
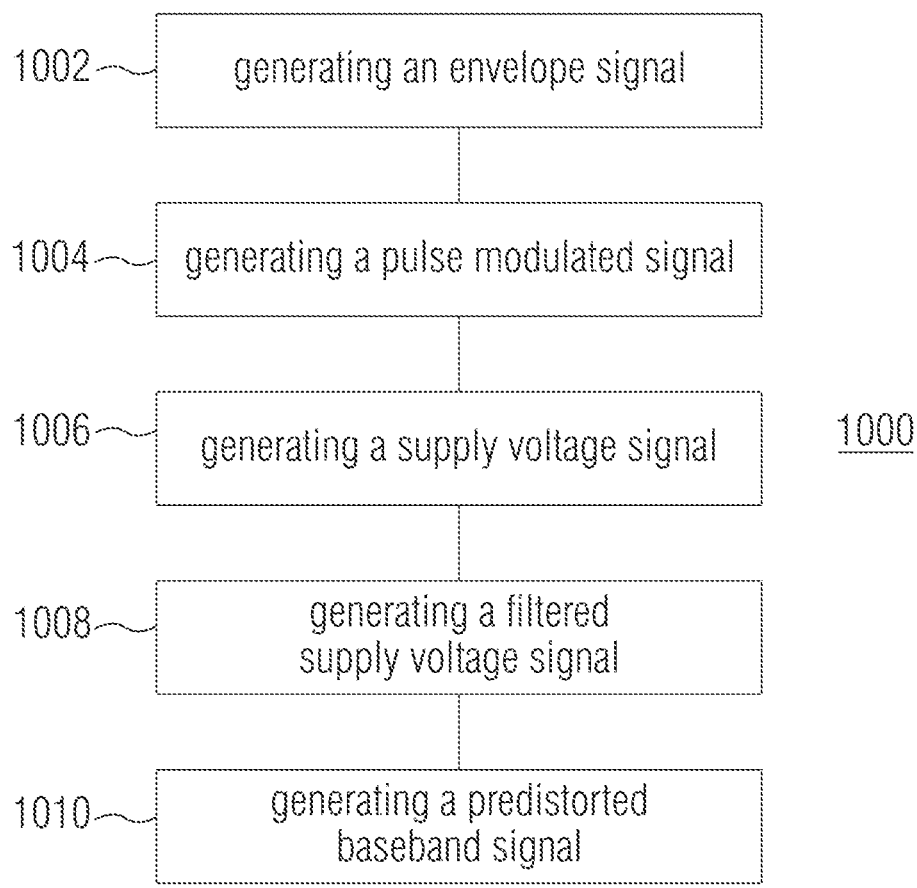
FIG. 10 illustrates a flowchart of an example of another method for operating a transmitter.

An example of another method 1000 for operating a transmitter is illustrated by means of a flowchart in FIG. 10. Method 1000 comprises generating 002, based on a baseband signal, an envelope signal indicating a temporal course of the baseband signal's envelope. Further, method 1000 comprises generating 1004, using a sigma-delta encoder, a pulse modulated signal based on the envelope signal. Additionally, method 1000 comprises generating 1006, based on the pulse modulated signals, a supply voltage signal having predefined voltage levels, and generating 1008 a filtered supply voltage signal for a power amplifier of the transmitter based on the supply voltage signal. Method 1000 further comprises generating 1010 a predistorted baseband signal based on the baseband signal and an adjustable predistortion configuration, wherein the predistortion configuration is adjusted based on a control signal related to the pulse modulated signal.

More details and aspects of the method are mentioned in connection with the proposed technique or one or more examples described above (e.g. FIG. 7). The method may comprise one or more additional optional features corresponding to one or more aspects of the proposed technique or one or more examples described above.

The proposed technique may allow to extend usage of the well-established envelope tracking techniques for power consumption reduction for higher bandwidth systems (e.g. LTE, 5G NR, WLAN, etc.).

The examples as described herein may be summarized as follows:

Example 1 is a transmitter, comprising: an envelope tracking circuit, wherein the envelope tracking circuit comprises: an envelope circuit configured to generate, based on a baseband signal, an envelope signal indicating a temporal course of the baseband signal's envelope; a bandwidth reduction circuit configured to generate a bandwidth reduced envelope signal based on the envelope signal; and a DC-to-DC converter configured to generate a supply voltage for a power amplifier of the transmitter based on the bandwidth reduced envelope signal, and a predistortion circuit configured to generate a predistorted baseband signal based on the baseband signal and an adjustable predistortion configuration, wherein the predistortion circuit is further configured to adjust the predistortion configuration based on the bandwidth reduced envelope signal.

Example 2 is the transmitter of example 1, wherein the envelope signal indicates the temporal course of the baseband signal's envelope using discrete signal levels, and wherein the bandwidth reduction circuit is configured to generate the bandwidth reduced envelope signal by modifying a transient between two consecutive discrete signal levels in the envelope signal.

Example 3 is the transmitter of example 2, wherein the bandwidth reduction circuit is configured to modify the transient by replacing the transient with a linear interpolation between the two consecutive discrete signal levels in the envelope signal.

Example 4 is the transmitter of example 3, wherein an absolute value of the linear interpolation's slope over time is smaller than an absolute value of the transient's slope over time.

Example 5 is the transmitter of example 3 or example 4, wherein the predistortion circuit is configured to generate the predistorted baseband signal using: a first predistortion configuration while the bandwidth reduced envelope signal exhibits the first one of the two consecutive discrete signal levels; a second predistortion configuration while the bandwidth reduced envelope signal exhibits the second one of the two consecutive discrete signal levels; and a linearly changing combination of the first predistortion configuration and the second predistortion configuration while the bandwidth reduced envelope signal exhibits the linear interpolation between the two consecutive discrete signal levels.

Example 6 is the transmitter of example 5, wherein the predistortion circuit comprises: a first predistorter configured to generate a first auxiliary predistorted baseband signal based on the baseband signal and the first predistortion configuration; a second predistorter configured to generate a second auxiliary predistorted baseband signal based on the baseband signal and the second predistortion configuration; and a signal combiner configured to generate the predistorted baseband signal using linearly changing contributions of the first auxiliary predistorted baseband signal and the second auxiliary predistorted baseband signal while the bandwidth reduced envelope signal exhibits the linear interpolation between the two consecutive discrete signal levels.

Example 7 is the transmitter of example 5, wherein the predistortion circuit comprises: a predistorter configured to generate the predistorted baseband signal based on the baseband signal and a set of predistortion coefficients; and a predistortion configuration circuit configured to linearly change the set of predistortion coefficients from a first set of predistortion coefficients related to the first predistortion configuration to a second set of predistortion coefficients related to the second predistortion configuration while the bandwidth reduced envelope signal exhibits the linear interpolation between the two consecutive discrete signal levels.

Example 8 is the transmitter of example 2, wherein the bandwidth reduction circuit comprises a digital filter configured to modify the transient.

Example 9 is the transmitter of example 2, wherein the bandwidth reduction circuit is configured to modify the transient using a window function.

Example 10 is the transmitter of any of examples 1 to 9, wherein the envelope tracking circuit further comprises: a digital-to-analog converter configured to generate an analog control voltage for the DC-to-DC converter based on the bandwidth reduced envelope signal.

Example 11 is the transmitter of any of examples 1 to 10, further comprising: a mixer configured to generate a radio frequency signal for the power amplifier based on the predistorted baseband signal.

Example 12 is a transmitter, comprising: an envelope tracking circuit, wherein the envelope tracking circuit comprises: an envelope circuit configured to generate, based on a baseband signal, an envelope signal indicating a temporal course of the baseband signal's envelope; a sigma-delta encoder configured to generate a pulse modulated signal based on the envelope signal; a DC-to-DC converter configured to generate, based on the pulse modulated signal, a supply voltage signal having predefined voltage levels; and an analog filter configured generate a filtered supply voltage signal for a power amplifier of the transmitter based on the supply voltage signal, and a predistortion circuit configured to generate a predistorted baseband signal based on the baseband signal and an adjustable predistortion configuration, wherein the predistortion circuit is further configured to adjust the predistortion configuration based on a control signal related to the pulse modulated signal.

Example 13 is the transmitter of example 12, further comprising: a digital filter configured to generate the control signal based on the pulse modulated signal and a filter model, wherein the filter model represents the signal processing behavior of the DC-to-DC converter and the analog filter.

Example 14 is the transmitter of example 12 or example 13, wherein a sample frequency of the sigma-delta encoder is selected such that shaped noise in the pulse modulated signal is at frequencies of at least six times a bandwidth of the baseband signal.

Example 15 is the transmitter of example 14, wherein the analog filter is configured to remove signal components from the supply voltage signal related to the shaped noise in the pulse modulated signal.

Example 16 is the transmitter of example 14 or example 15, wherein the sample frequency is different from other frequencies used within the transmitter.

Example 17 is the transmitter of any of examples 12 to 16, wherein the pulse modulated signal is a pulse-width modulated signal or a pulse-frequency modulated signal.

Example 18 is the transmitter of any of examples 12 to 17, further comprising: a mixer configured to generate a radio frequency signal for the power amplifier based on the predistorted baseband signal.

Example 19 is the transmitter of any of examples 12 to 18, wherein the predistortion circuit comprises: a plurality of predistorters configured to generate auxiliary predistorted baseband signals based on the baseband signal and respective predistortion configurations; and a signal combiner configured to generate the predistorted baseband signal based on adjustable contributions of the auxiliary predistorted baseband signals, wherein the contributions of the auxiliary predistorted baseband signals are adjusted based on the control signal.

Example 20 is the transmitter of any of examples 12 to 18, wherein the predistortion circuit comprises: a predistorter configured to generate the predistorted baseband signal based on the baseband signal and predistortion coefficients; and a predistortion configuration circuit configured to adjust the predistortion coefficients based on the control signal.

Example 21 is a mobile device comprising a transmitter according to any of examples 1 to 20.

Example 22 is the mobile device of example 21, further comprising at least one antenna element coupled to the transmitter.

Example 23 is a method for operating a transmitter, comprising: generating, based on a baseband signal, an envelope signal indicating a temporal course of the baseband signal's envelope; generating a bandwidth reduced envelope signal based on the envelope signal; generating a power supply voltage for a power amplifier of the transmitter based on the bandwidth reduced envelope signal; and generating a predistorted baseband signal based on the baseband signal and an adjustable predistortion configuration, wherein the predistortion configuration is adjusted based on the bandwidth reduced envelope signal.

Example 24 is the method of example 23, wherein the envelope signal indicates the temporal course of the baseband signal's envelope using discrete signal levels, and wherein generating the bandwidth reduced envelope signal comprises: modifying a transient between two consecutive discrete signal levels in the envelope signal.

Example 25 is the method of example 24, wherein modifying the transient comprises: replacing the transient with a linear interpolation between the two consecutive discrete signal levels in the envelope signal.

Example 26 is the method of example 25, wherein an absolute value of the linear interpolation's slope over time is smaller than an absolute value of the transient's slope over time.

Example 27 is the method of example 25 or example 26, wherein the predistorted baseband signal is generated using: a first predistortion configuration while the bandwidth reduced envelope signal exhibits the first one of the two consecutive discrete signal levels; a second predistortion configuration while the bandwidth reduced envelope signal exhibits the second one of the two consecutive discrete signal levels; and a linearly changing combination of the first predistortion configuration and the second predistortion configuration while the bandwidth reduced envelope signal exhibits the linear interpolation between the two consecutive discrete signal levels.

Example 28 is the method of example 24, wherein a digital filter is used for modifying the transient.

Example 29 is the method of example 24, wherein a window function is used for modifying the transient.

Example 30 is the method of any of examples 23 to 29, further comprising: generating an analog control voltage for the DC-to-DC converter based on the bandwidth reduced envelope signal.

Example 31 is the method of any of examples 23 to 30, further comprising: generating a radio frequency signal for the power amplifier based on the predistorted baseband signal.

Example 32 is a method for operating a transmitter, comprising: generating, based on a baseband signal, an envelope signal indicating a temporal course of the baseband signal's envelope; generating, using a sigma-delta encoder, a pulse modulated signal based on the envelope signal; generating, based on the pulse modulated signals, a supply voltage signal having predefined voltage levels; generating a filtered supply voltage signal for a power amplifier of the transmitter based on the supply voltage signal; and generating a predistorted baseband signal based on the baseband signal and an adjustable predistortion configuration, wherein the predistortion configuration is adjusted based on a control signal related to the pulse modulated signal.

Example 33 is the method of example 32, further comprising: generating the control signal based on the pulse modulated signal and a filter model, wherein the filter model represents the generation of the filtered supply voltage signal.

Example 34 is the method of example 32 or example 33, wherein a sample frequency of the sigma-delta encoder is selected such that shaped noise in the pulse modulated signal is at frequencies of at least six times a bandwidth of the baseband signal.

Example 35 is the method of example 34, wherein generating the filtered supply voltage signal comprises: removing signal components from the supply voltage signal related to the shaped noise in the pulse modulated signal.

Example 36 is the method of example 34 or example 35, wherein the sample frequency is different from other frequencies used within the transmitter.

Example 37 is the method of any of examples 32 to 36, wherein the pulse modulated signal is a pulse-width modulated signal or a pulse-frequency modulated signal.

Example 38 is the method of any of examples 32 to 37, further comprising: generating a radio frequency signal for the power amplifier based on the predistorted baseband signal.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A transmitter, comprising:
    a power amplifier configured to provide a radio frequency signal; and
    an envelope tracking circuit configured to:
        generate, based on a baseband signal, an envelope signal indicating a temporal course of the baseband signal's envelope using discrete signal levels;
        generate a bandwidth reduced envelope signal based on the envelope signal by modifying a transient between two consecutive discrete signal levels in the envelope signal; and
        generate a supply voltage for the power amplifier based on the bandwidth reduced envelope signal.

2. The transmitter of claim 1, wherein the envelope tracking circuit is configured to modify the transient by replacing the transient with a linear interpolation between the two consecutive discrete signal levels in the envelope signal.

3. The transmitter of claim 2, wherein an absolute value of the linear interpolation's slope over time is smaller than an absolute value of the transient's slope over time.

4. The transmitter of claim 1, wherein the envelope tracking circuit is further configured to:
    generate an analog control voltage for the DC-to-DC converter based on the bandwidth reduced envelope signal.

5. The transmitter of claim 1, further comprising:
    a predistortion circuit configured to generate a predistorted baseband signal based on the baseband signal and an adjustable predistortion configuration, wherein the predistortion circuit is further configured to adjust the predistortion configuration based on the bandwidth reduced envelope signal.

6. The transmitter of claim 5, wherein the envelope tracking circuit is configured to modify the transient by replacing the transient with a linear interpolation between the two consecutive discrete signal levels in the envelope signal; and
    wherein the predistortion circuit is configured to generate the predistorted baseband signal using:
        a first predistortion configuration while the bandwidth reduced envelope signal exhibits the first one of the two consecutive discrete signal levels;
        a second predistortion configuration while the bandwidth reduced envelope signal exhibits the second one of the two consecutive discrete signal levels; and
        a linearly changing combination of the first predistortion configuration and the second predistortion configuration while the bandwidth reduced envelope signal exhibits the linear interpolation between the two consecutive discrete signal levels.

7. The transmitter of claim 6, wherein the predistortion circuit comprises:
    a first predistorter configured to generate a first auxiliary predistorted baseband signal based on the baseband signal and the first predistortion configuration;
    a second predistorter configured to generate a second auxiliary predistorted baseband signal based on the baseband signal and the second predistortion configuration; and
    a signal combiner configured to generate the predistorted baseband signal using linearly changing contributions of the first auxiliary predistorted baseband signal and the second auxiliary predistorted baseband signal while the bandwidth reduced envelope signal exhibits the linear interpolation between the two consecutive discrete signal levels.

8. The transmitter of claim 6, wherein the predistortion circuit comprises:
    a predistorter configured to generate the predistorted baseband signal based on the baseband signal and a set of predistortion coefficients; and
    a predistortion configuration circuit configured to linearly change the set of predistortion coefficients from a first set of predistortion coefficients related to the first predistortion configuration to a second set of predistortion coefficients related to the second predistortion configuration while the bandwidth reduced envelope signal exhibits the linear interpolation between the two consecutive discrete signal levels.

9. A mobile device comprising:
an antenna element configured to radiate radio frequency signals; and
a transmitter communicatively coupled to the antenna element and configured to perform operations comprising:
generating, based on a baseband signal, an envelope signal indicating a temporal course of the baseband signal's envelope using discrete signal levels;
generating a bandwidth reduced envelope signal based on the envelope signal by modifying a transient between two consecutive discrete signal levels in the envelope signal; and
generating a power supply voltage for a power amplifier of the mobile device based on the bandwidth reduced envelope signal.

10. The mobile device of claim 9, the operations further comprising:
generating a predistorted baseband signal based on the baseband signal and an adjustable predistortion configuration, wherein the predistortion configuration is adjusted based on the bandwidth reduced envelope signal.

11. The mobile device of claim 10, the operations further comprising modifying the transient by replacing the transient with a linear interpolation between the two consecutive discrete signal levels in the envelope signal;
wherein generating the the predistorted baseband signal comprises using:
a first predistortion configuration while the bandwidth reduced envelope signal exhibits the first one of the two consecutive discrete signal levels;
a second predistortion configuration while the bandwidth reduced envelope signal exhibits the second one of the two consecutive discrete signal levels; and
a linearly changing combination of the first predistortion configuration and the second predistortion configuration while the bandwidth reduced envelope signal exhibits the linear interpolation between the two consecutive discrete signal levels.

12. The mobile device of claim 1, wherein generating the predistorted baseband signal comprises:
generating a first auxiliary predistorted baseband signal based on the baseband signal and the first predistortion configuration;
generating a second auxiliary predistorted baseband signal based on the baseband signal and the second predistortion configuration; and
generating the predistorted baseband signal using linearly changing contributions of the first auxiliary predistorted baseband signal and the second auxiliary predistorted baseband signal while the bandwidth reduced envelope signal exhibits the linear interpolation between the two consecutive discrete signal levels.

13. The mobile device of claim 11, wherein generating the predistorted baseband signal comprises:
generating the predistorted baseband signal based on the baseband signal and a set of predistortion coefficients; and
linearly changing the set of predistortion coefficients from a first set of predistortion coefficients related to the first predistortion configuration to a second set of predistortion coefficients related to the second predistortion configuration while the bandwidth reduced envelope signal exhibits the linear interpolation between the two consecutive discrete signal levels.

14. An envelope tracking circuit comprising:
an envelope circuit configured to generate, based on a baseband signal, an envelope signal indicating a temporal course of the baseband signal's envelope using discrete signal levels;
a bandwidth reduction circuit configured to generate a bandwidth reduced envelope signal based on the envelope signal by modifying a transient between two consecutive discrete signal levels in the envelope signal; and
a DC-to-DC converter configured to generate a supply voltage for a power amplifier based on the bandwidth reduced envelope signal.

15. The envelope tracking circuit of claim 14, wherein the bandwidth reduction circuit is configured to modify the transient by replacing the transient with a linear interpolation between the two consecutive discrete signal levels in the envelope signal.

16. The envelope tracking circuit of claim 15, wherein an absolute value of the linear interpolation's slope over time is smaller than an absolute value of the transient's slope over time.

17. The envelope tracking circuit of claim 14, wherein the bandwidth reduction circuit is configured to modify the transient by using a window function.

18. The envelope tracking circuit of claim 17, wherein the bandwidth reduction circuit is configured to modify the transient by replacing the transient with a linear interpolation between the two consecutive discrete signal levels in the envelope signal; and
wherein the predistortion circuit is configured to generate the predistorted baseband signal using:
a first predistortion configuration while the bandwidth reduced envelope signal exhibits the first one of the two consecutive discrete signal levels;
a second predistortion configuration while the bandwidth reduced envelope signal exhibits the second one of the two consecutive discrete signal levels; and
a linearly changing combination of the first predistortion configuration and the second predistortion configuration while the bandwidth reduced envelope signal exhibits the linear interpolation between the two consecutive discrete signal levels.

19. The envelope tracking circuit of claim 18, wherein the predistortion circuit comprises:
a first predistorter configured to generate a first auxiliary predistorted baseband signal based on the baseband signal and the first predistortion configuration;
a second predistorter configured to generate a second auxiliary predistorted baseband signal based on the baseband signal and the second predistortion configuration; and
a signal combiner configured to generate the predistorted baseband signal using linearly changing contributions of the first auxiliary predistorted baseband signal and the second auxiliary predistorted baseband signal while the bandwidth reduced envelope signal exhibits the linear interpolation between the two consecutive discrete signal levels.

20. The envelope tracking circuit of claim 18, wherein the predistortion circuit comprises:
- a predistorter configured to generate the predistorted baseband signal based on the baseband signal and a set of predistortion coefficients; and
- a predistortion configuration circuit configured to linearly change the set of predistortion coefficients from a first set of predistortion coefficients related to the first predistortion configuration to a second set of predistortion coefficients related to the second predistortion configuration while the bandwidth reduced envelope signal exhibits the linear interpolation between the two consecutive discrete signal levels.

* * * * *

UNITED STATES PATENT AND TRADEMARK OFFICE
CERTIFICATE OF CORRECTION

| | |
|---|---|
| PATENT NO. | : 11,271,600 B2 |
| APPLICATION NO. | : 16/976657 |
| DATED | : March 8, 2022 |
| INVENTOR(S) | : Alexander Belitzer et al. |

Page 1 of 1

It is certified that error appears in the above-identified patent and that said Letters Patent is hereby corrected as shown below:

In the Claims

Column 17, Line 35, delete "the the" and insert --the--.

Signed and Sealed this
Twentieth Day of June, 2023

Katherine Kelly Vidal
*Director of the United States Patent and Trademark Office*